United States Patent
Hanczewski et al.

(10) Patent No.: US 11,852,024 B2
(45) Date of Patent: Dec. 26, 2023

(54) ELECTRICAL STRUT FOR A TURBINE ENGINE

(71) Applicant: GE Aviation Systems LLC, Grand Rapids, MI (US)

(72) Inventors: Pawel Piotr Hanczewski, Warsaw (PL); Mohamed Osama, Garching (DE); Pawel Pawlowski, Zyrardów (PL)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 17/540,779

(22) Filed: Dec. 2, 2021

(65) Prior Publication Data
US 2022/0195887 A1 Jun. 23, 2022

(30) Foreign Application Priority Data
Dec. 18, 2020 (PL) .......................... 436397

(51) Int. Cl.
 *F01D 25/12* (2006.01)
 *F01D 9/02* (2006.01)
 (Continued)

(52) U.S. Cl.
 CPC ............... *F01D 25/12* (2013.01); *F01D 9/02* (2013.01); *H02G 5/10* (2013.01);
 (Continued)

(58) Field of Classification Search
 CPC .......... F01D 9/065; F01D 15/10; F01D 25/12; F01D 25/162; F01D 25/30; F01D 17/02; F01D 21/003; F01D 25/00; F01D 9/02; F01D 17/24; F01D 5/147; F01D 5/187; F01D 9/04; F01D 9/041; F05D 2220/76; F05D 2220/323; F05D 2220/32; F05D 2240/12; F05D 2250/12; F05D 2260/20; H02G 5/10; H02G 3/04; H02G 3/0487; H02G 3/22; H05K 9/0081
 See application file for complete search history.

(56) References Cited

U.S. PATENT DOCUMENTS 2,827,760 A * 3/1958 Marchant ................ F02C 7/047
 60/39.83
7,619,331 B2 * 11/2009 Bouiller .................. F02C 7/268
 310/71

(Continued)

FOREIGN PATENT DOCUMENTS

EP 1811132 A1 7/2007
EP 3447243 A1 2/2019
(Continued)

*Primary Examiner* — Eric J Zamora Alvarez
(74) *Attorney, Agent, or Firm* — McGarry Bair PC

(57) ABSTRACT

A turbine engine that includes an engine core, a core casing surrounding the engine core, at least one cowl surrounding the core casing, a power converter located between the at least one cowl and the core casing, an electrical generator disposed within the engine core, at least one electrical strut having an outer wall defining an interior and extending radially between the engine core and the core casing; and at least one electrical conduit located within the interior and electrically coupling the generator to the power converter.

20 Claims, 8 Drawing Sheets

(51) Int. Cl.
  *F01D 5/18* (2006.01)
  *F01D 15/10* (2006.01)
  *F01D 25/16* (2006.01)
  *F01D 25/30* (2006.01)
  *F01D 9/06* (2006.01)
  *F01D 9/04* (2006.01)
  *F01D 25/00* (2006.01)
  *H02G 5/10* (2006.01)
  *H05K 9/00* (2006.01)

(52) U.S. Cl.
  CPC .... *F05D 2220/323* (2013.01); *F05D 2240/12* (2013.01); *F05D 2260/20* (2013.01); *H05K 9/0081* (2013.01)

(56) References Cited

U.S. PATENT DOCUMENTS

| | | | |
|---|---|---|---|
| 8,899,529 B2 | 12/2014 | Sanderson | |
| 9,725,163 B2 | 8/2017 | Edelson et al. | |
| 10,622,771 B2 | 4/2020 | Yang et al. | |
| 10,651,761 B2 | 5/2020 | Pal | |
| 10,752,369 B2 | 8/2020 | Takami et al. | |
| 2007/0217905 A1 | 9/2007 | Bouiller et al. | |
| 2010/0327111 A1 | 12/2010 | Sanderson | |
| 2015/0211801 A1* | 7/2015 | Philippart | F02K 3/115 165/104.14 |
| 2015/0336660 A1 | 11/2015 | Edelson et al. | |
| 2017/0166324 A1* | 6/2017 | Smith | H02B 1/20 |
| 2018/0044028 A1 | 2/2018 | Takami et al. | |
| 2018/0051702 A1* | 2/2018 | Kupiszewski | F02C 3/04 |
| 2018/0358785 A1* | 12/2018 | Roberts | H02B 1/011 |
| 2019/0316486 A1* | 10/2019 | Roberge | H02K 7/116 |
| 2020/0083655 A1 | 3/2020 | Yang et al. | |
| 2020/0091832 A1 | 3/2020 | Pal | |
| 2020/0295803 A1 | 9/2020 | Gellert et al. | |
| 2020/0328654 A1 | 10/2020 | Lighty et al. | |
| 2021/0324799 A1* | 10/2021 | Suzuki | F01D 9/065 |

FOREIGN PATENT DOCUMENTS

| | | |
|---|---|---|
| EP | 3553295 A1 | 10/2019 |
| EP | 2978074 B1 | 9/2020 |
| EP | 3767080 A2 | 1/2021 |
| EP | 3832097 A1 | 6/2021 |
| EP | 3879074 A1 | 9/2021 |
| GB | 2545446 A1 | 6/2017 |
| WO | 2020166342 A1 | 8/2020 |

* cited by examiner

ELECTRICAL STRUT FOR A TURBINE ENGINE

CROSS REFERENCE TO RELATED APPLICATION(S)

This application claims priority to and benefit of PL Patent Application No. 436397 filed Dec. 18, 2020, which is incorporated herein in its entirety.

TECHNICAL FIELD

This disclosure relates to an electrical conduit, and more particularly to an electrical conduit in a strut of a turbine engine.

BACKGROUND

Electrical systems, such as aircraft electrical systems, commonly include power converters, generators, onboard grid and various loads. Inverters, for example, are commonly employed to convert direct current (DC) power into alternating current (AC) power for AC loads connected to the electrical system. Opposite, AC to DC conversion is also frequently used. Increased electrical power supply determines higher operating voltage and greater current density. Transferring high density electrical power requires AC and DC onboard grid components capable of withstanding higher electrical, mechanical and thermal stress while maintaining low overall losses at minimum weight.

BRIEF DESCRIPTION

Aspects and advantages of the disclosure will be set forth in part in the following description, or may be obvious from the description, or may be learned through practice of the disclosure herein.

In one aspect, the disclosure relates to an airfoil for a turbine engine, the airfoil comprising an outer wall having a pressure side, a suction side, a leading edge, and a trailing edge, the outer wall defining an interior, wherein the outer wall extends between the pressure side and the suction side to define a lateral direction, between the leading edge and the trailing edge to define a chord-wise direction, and between a root and a tip to define a span-wise direction; and at least one electrical conduit extending within the interior along the span-wise direction and defining a cooling conduit with a hollow interior.

In another aspect, the disclosure relates to a turbine engine comprising an engine core; a core casing surrounding the engine core; at least one cowl surrounding the core casing; a power converter located between the at least one cowl and the core casing; an electrical generator disposed within the engine core; at least one electrical strut having an outer wall defining an interior and extending radially between the engine core and the core casing; and at least one electrical conduit located within the interior and electrically coupling the generator to the power converter.

In yet another aspect, the disclosure relates to a method of forming an airfoil for a turbine engine, the method comprising forming an outer wall having a pressure side, a suction side, a leading edge, and a trailing edge, the outer wall defining an interior, wherein the outer wall extends between the pressure side and the suction side to define a lateral direction, between the leading edge and the trailing edge to define a chord-wise direction, and between a root and a tip to define a span-wise direction; and extending at least one electrical conduit within the interior along the span-wise direction and to define a cooling conduit with a hollow interior; wherein a cross-sectional area of the at least one electrical conduit has a width oriented along the chord-wise direction and a height oriented along the lateral direction, the width and height together defining an aspect ratio of the cross-sectional area; and wherein the largest dimension measured along the lateral direction between the pressure side and suction side defines a maximum thickness.

These and other features, aspects and advantages of the present disclosure will become better understood with reference to the following description and appended claims. The accompanying drawings, which are incorporated in and constitute a part of this specification, illustrate aspects of the disclosure and, together with the description, serve to explain the principles of the disclosure.

BRIEF DESCRIPTION OF THE DRAWINGS

A full and enabling disclosure, including the best mode thereof, directed to one of ordinary skill in the art, is set forth in the specification, which refers to the appended figures in which.

In the drawings.

DETAILED DESCRIPTION

Figure 1:
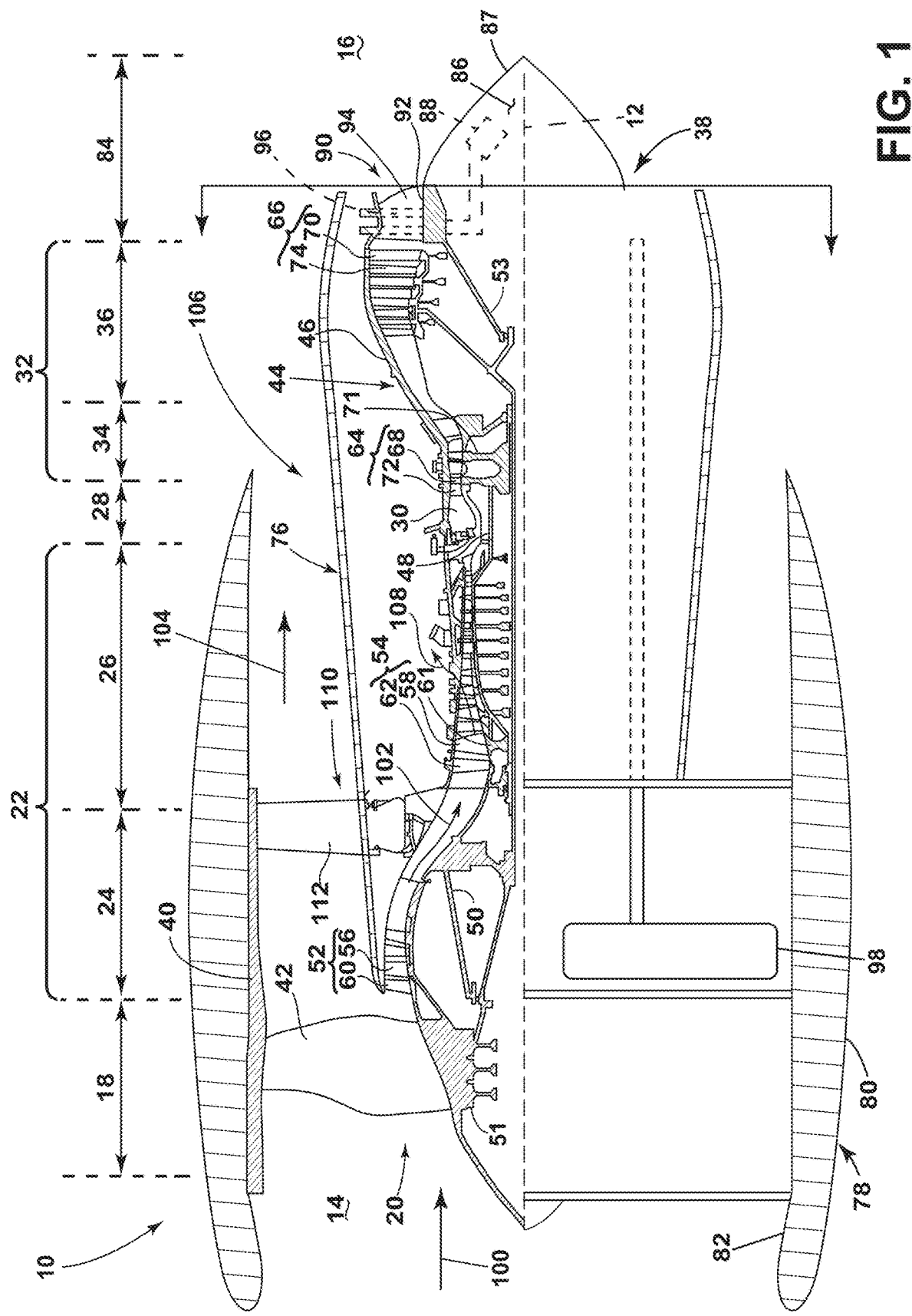
FIG. 1 is a schematic view of a turbine engine with tail-cone section housing a generator and a partial sectional cutaway along a turbine engine axis of rotation illustrating a power converter.

Aspects of the disclosure herein are directed to an electrical conduit within a strut, referred to herein as an electrical strut, extending between an engine core of a turbine engine and a casing of the turbine engine. For purposes of illustration, the present disclosure will be described with respect to a turbine rear frame for a gas turbine engine. More specifically, the present disclosure will focus on customizing three phase, or any multiplication of three phase busbars, within an electrical conduit to minimize losses and maximize loss dissipation in various cooling conditions while adapting to very limited space available. It will be understood, however, that aspects of the disclosure described herein are not so limited and may have general applicability within an engine, including compressors, as well as in non-aircraft applications, such as other mobile applications and non-mobile industrial, commercial, and residential applications.

For purposes of illustration, the present disclosure will be described with respect to a turbine engine for an aircraft. The disclosure can have applicability in a variety of vehicles or engines, and can be used to provide benefits in industrial, commercial, and residential applications. Further non-limiting examples of other vehicles or engines to which the disclosure can relate can include boats, helicopters, cars, or other aquatic, air, space, or land vehicles. Industrial, commercial, or residential applications of the disclosure can include, but are not limited to, marine power plants, wind turbines, or small power plants.

As used herein, the term "upstream" refers to a direction that is opposite the fluid flow direction, and the term "downstream" refers to a direction that is in the same direction as the fluid flow. The term "fore" or "forward" means in front of something and "aft" or "rearward" means behind something. For example, when used in terms of fluid flow, fore/forward can mean upstream and aft/rearward can mean downstream.

Additionally, as used herein, the terms "radial" or "radially" refer to a direction away from a common center. For example, in the overall context of a turbine engine, radial refers to a direction along a ray extending between a center longitudinal axis of the engine and an outer engine circumference. Furthermore, as used herein, the term "set" or a "set" of elements can be any number of elements, including only one.

Additionally, as used herein, elements being "electrically connected," "electrically coupled," or "in signal communication" can include an electric transmission or signal being sent, received, or communicated to or from such connected or coupled elements. Furthermore, such electrical connections or couplings can include a wired or wireless connection, or a combination thereof.

Also, as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor as defined above, and the controller module or processor can perform processing on the value to determine a representative value or an electrical characteristic representative of said value.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are used only for identification purposes to aid the reader's understanding of the present disclosure, and should not be construed as limiting on an example, particularly as to the position, orientation, or use of aspects of the disclosure described herein. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 is a schematic partial section view of a turbine engine 10 for an aircraft, where an upper section of FIG. 1 illustrates the cross section of the turbine engine 10 and a lower section illustrates a schematic of static support structures and an accessory gearbox.

The turbine engine 10 has a centerline or turbine engine axis of rotation 12 extending forward 14 to aft 16. The turbine engine 10 can include, in downstream serial flow relationship, a fan section 18 including a fan assembly 20, a compressor section 22 including a booster or low pressure (LP) compressor 24 and a high pressure (HP) compressor 26, a combustion section 28 including a combustor 30, a turbine section 32 including a HP turbine 34, and a LP turbine 36, an exhaust section 38, and tail-cone section 84. It should be understood that while illustrated as having multiple sections, the turbine engine 10 as described herein need not necessarily have all sections described, for example a turbine engine 10 without a fan assembly 20.

The fan section 18 includes a fan casing 40 surrounding the fan assembly 20. The fan assembly 20 includes a plurality of fan blades 42 disposed radially about the turbine engine axis of rotation 12. The HP compressor 26, the combustor 30, and the HP turbine 34 form an engine core 44, which generates combustion gases. The engine core 44 is surrounded by core casing 46, which can be coupled with the fan casing 40. The engine core 44 can include a tail-cone section 84.

An HP shaft or HP spool 48 disposed coaxially about the turbine engine axis of rotation 12 of the turbine engine 10 drivingly connects the HP turbine 34 to the HP compressor 26. An LP shaft or LP spool 50, which is disposed coaxially about the turbine engine axis of rotation 12 of the turbine engine 10 within the larger diameter annular HP spool 48, drivingly connects the LP turbine 36 to the LP compressor 24 and fan assembly 20.

The LP compressor 24 and the HP compressor 26 respectively include a plurality of compressor stages 52, 54, in which a set of compressor blades 56, 58 rotate relative to a corresponding set of static compressor vanes 60, 62, which can also be called a nozzle, to compress or pressurize the stream of fluid passing through the stage. In a single compressor stage 52, 54, multiple compressor blades 56, 58 can be provided in a ring and can extend radially outwardly relative to the turbine engine axis of rotation 12, from a blade platform to a blade tip, while the corresponding static compressor vanes 60, 62 are positioned upstream of and adjacent to the rotating compressor blades 56, 58. It is noted that the number of blades, vanes, and compressor stages shown in FIG. 1 were selected for illustrative purposes only, and that other numbers are possible.

The compressor blades 56, 58 for a stage of the compressor can be mounted to a disk 61, which is mounted to the corresponding one of the HP spool 48 and LP spool 50, with each stage having its own disk 61. The vanes 60, 62 for a stage of the compressor can be mounted to the core casing 46 in a circumferential arrangement.

The HP turbine 34 and the LP turbine 36 respectively include a plurality of turbine stages 64, 66, in which a set of turbine blades 68, 70 are rotated relative to a corresponding set of static turbine vanes 72, 74, which can also be called a nozzle, to extract energy from the stream of fluid passing through the stage. In a single turbine stage 64, 66, multiple turbine blades 68, 70 can be provided in a ring and can extend radially outwardly relative to the turbine engine axis of rotation 12, from a blade platform to a blade tip, while the corresponding static turbine vanes 72, 74 are positioned upstream of and adjacent to the rotating blades 68, 70. It is noted that the number of blades, vanes, and turbine stages shown in FIG. 1 were selected for illustrative purposes only, and that other numbers are possible.

The blades 68, 70 for a stage of the turbine can be mounted to a disk 71, which is mounted to the corresponding one of the HP spool 48 and LP spool, 50, with each stage having a dedicated disk 71. The vanes 72, 74 for a stage of the compressor can be mounted to the core casing 46 in a circumferential arrangement.

The HP spool 48 and LP spool 50 are rotatable about the engine centerline and couple to a plurality of rotatable elements, which can collectively define a rotor 51.

Collectively the rotatable portions of the turbine engine 10, which can include either one of or both the HP Spool 48 and the LP spool 50, are individually or collectively referred to as a rotor 51. Complementary to the rotor portion, the stationary portions of the turbine engine 10, which can include the static vanes 60, 62, 72, 74 among the compressor section 22 and turbine section 32 are also referred to individually or collectively as a stator 53. As such, the rotor 51 can refer to an individual rotatable element or the combination of all rotatable elements in the engine 10, and the stator 53 can refer to an individual non-rotatable element or the combination of all non-rotating elements throughout the engine 10. Additionally, or alternatively, the turbine engine 10 can include multiple rotors, such as a first rotor and a second rotor each rotating in opposite directions. In one example, the compressor section 22 can include a single rotor, and the turbine section 32 can include multiple, counter-rotating rotors. In another example, the compressor section 22 and turbine section 32 can each include a single rotor and a single stator.

An inner cowl 76 is radially spaced from the engine core 44 and can circumscribe at least a portion of the engine core 44. A nacelle or outer cowl 78 is radially spaced from the inner cowl 76 and can circumscribe at least a portion of the inner cowl 76. The outer cowl 78 has a radially outer surface 80 and a radial inner surface 82, where the radial inner surface 82 faces the inner cowl 76. The outer cowl 78 can support or define the fan casing 40.

A tail-cone section 84, located in an aft portion of the engine, can define at least a portion of the stator 53 concentric within the inner cowl 76 and the outer cowl 78 respectively. The tail-cone section 84 can include a tail-cone 87 extending axially beyond the inner cowl 76 and defining a housing 86 for an electrical generator 88, referred to herein as a generator 88. The generator 88 can be driven by the LP turbine 36.

A static support system 90 can extend radially between a platform 92 at the tail-cone section 84 and the core casing 46. The static support system 90 can include at least one strut, by way of non-limiting example an electrical strut 94, in which at least one electrical conduit 96 is located. While illustrated as extending between the platform 92 and the core casing 46, it should be understood that the at least one strut can be any strut extending between concentric portions of the turbine engine 10 and is not limited to between the tail-cone section and the core casing 46.

A power converter 98 can be located proximate the forward 14 part of the turbine engine 10 on the fan casing 40. While illustrated on the fan casing 40, it is contemplated that the power converter 98 is located anywhere proximate the forward 14 part of the turbine engine 10.

In operation, an airflow 100 flows through the fan section 18 toward the inner cowl 76. The inner cowl 76 splits the airflow 100 into a bifurcated airflow path including a first portion or first airflow 102 through the engine core 44 and second portion or second airflow 104 that passes through a bypass airflow path 106. Therefore, the fan section 18 can be fluidly coupled to the engine core 44 and the bypass airflow path 106.

The first airflow 102 is channeled into the LP compressor 24, which then supplies pressurized airflow to the HP compressor 26, which further pressurizes the air. The first airflow 102 from the HP compressor 26 is mixed with fuel in the combustor 30 and ignited, thereby generating combustion gases. Some work is extracted from these gases by the HP turbine 34, which drives the HP compressor 26. The combustion gases are discharged into the LP turbine 36, which extracts additional work to drive the LP compressor 24, and the exhaust gas is ultimately discharged from the turbine engine 10 via the exhaust section 38. The driving of the LP turbine 36 drives the LP spool 50 to rotate the fan assembly 20 and the LP compressor 24. The first airflow 102 passes through the static support system 90 and more particularly by the electrical strut 94.

A portion of the first airflow 102 can be drawn from the compressor section 22 as bleed air 108. The bleed air 108 can be drawn from the first airflow 102 and provided to engine components requiring cooling. The temperature of first airflow 102 entering the combustor 30 is significantly increased. As such, cooling provided by the bleed air 108 is necessary for operating of such engine components in the heightened temperature environments.

The second airflow 104 travels through the bypass airflow path 106 defined by the inner cowl 76 and the outer cowl 78. The second airflow 104 bypasses the LP compressor 24 and the engine core 44 and exits the turbine engine 10 at the exhaust section 38. The bypass airflow path 106 can include a stationary vane row, and more particularly an outlet guide vane assembly 110, that includes a plurality of airfoil guide vanes 112. More specifically, a circumferential row of radially extending airfoil guide vanes 112 are utilized adjacent the fan section 18 to exert some directional control of the second airflow 104.

Some of the air supplied by the fan assembly 20 can bypass the engine core 44 and be used for cooling of portions, especially hot portions, of the turbine engine 10, and/or used to cool or power other aspects of the aircraft. In the context of a turbine engine, the hot portions of the engine are normally downstream of the combustor 30, especially the turbine section 32, with the HP turbine 34 being the hottest portion as it is directly downstream of the combustion section 28. Other sources of cooling fluid can be, but are not limited to, fluid discharged from the LP compressor 24 or the HP compressor 26.

Figure 2:
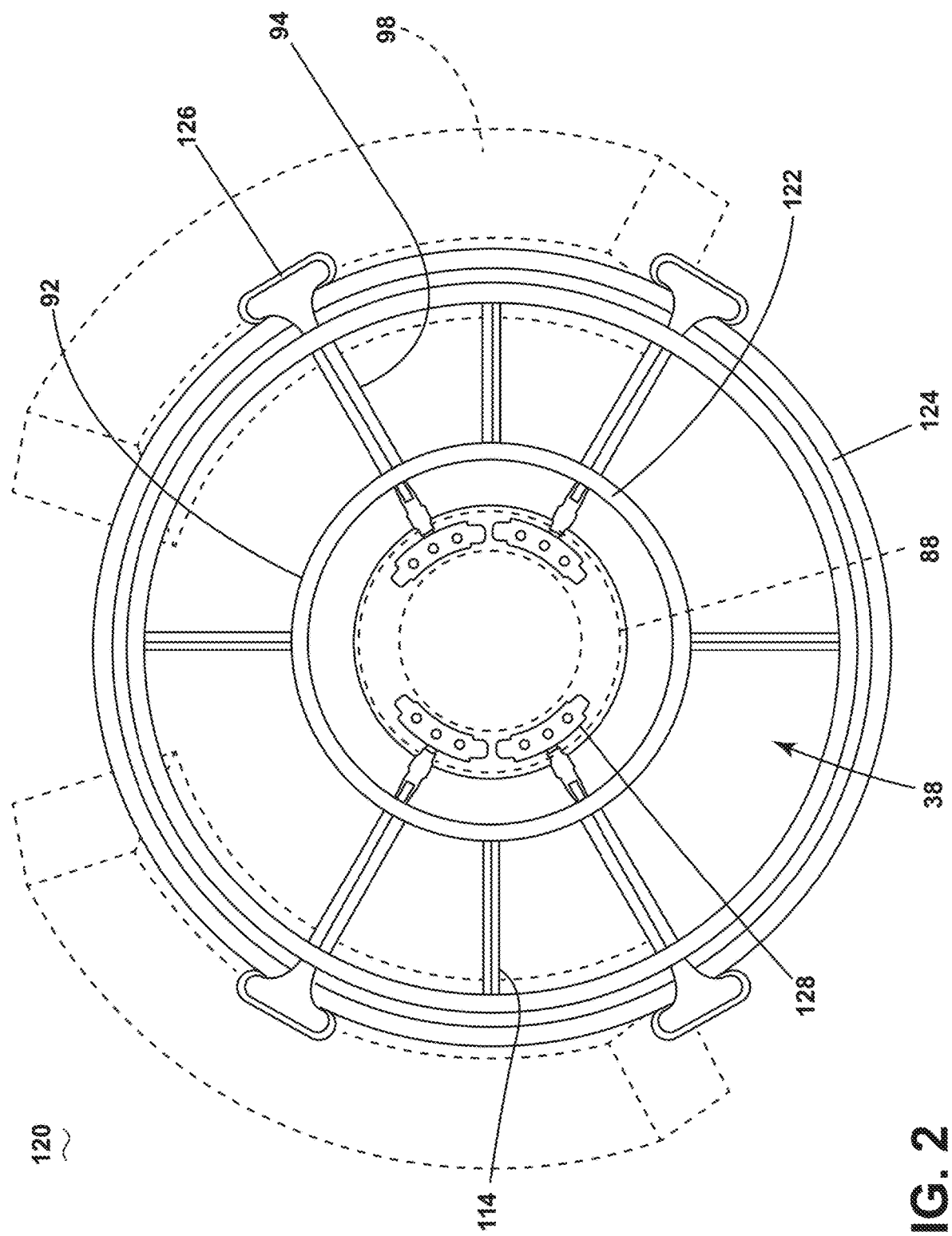
FIG. 2 is a rear view of the turbine engine of FIG. 1, illustrating a turbine rear frame and in particular a plurality of struts including an electrical strut according to aspects of the present disclosure.

FIG. 2 illustrates a view along line II-II of FIG. 1 looking forward 14 from the exhaust section 38 of the turbine engine 10. A turbine rear frame 120 is illustrated as having an inner band 122 and an outer band 124 radially spaced from and surrounding the inner band 122. The inner band 122 can define the platform 92 from which the electrical strut 94 extends. The outer band 124 can be coupled to or integral with the core casing 46. It can be more clearly seen that the static support system 90 can include multiple electrical struts 94 and at least one additional mechanical strut 114 extending between the inner band 122 and the outer band 124. While illustrated as twelve struts 94, 114, it should be understood that more or less struts are contemplated. The electrical struts 94 can either carry signal cables or carry electrical power.

At least one of the electrical struts 94 that carry electrical power extends between a converter connector 126 and a generator receptacle 128. The converter connector 126 can extend axially (into the page) toward the forward 14 of the turbine engine 10. The converter connector 126 can be configured to house the at least one electrical conduit 96 extending between the generator 88 and the power converter 98 illustrated in dashed line. The generator receptacle 128 can be configured to receive the at least one electrical conduit 96 and enable an electrical connection between the generator 88 and the at least one electrical conduit 96.

Figure 3:
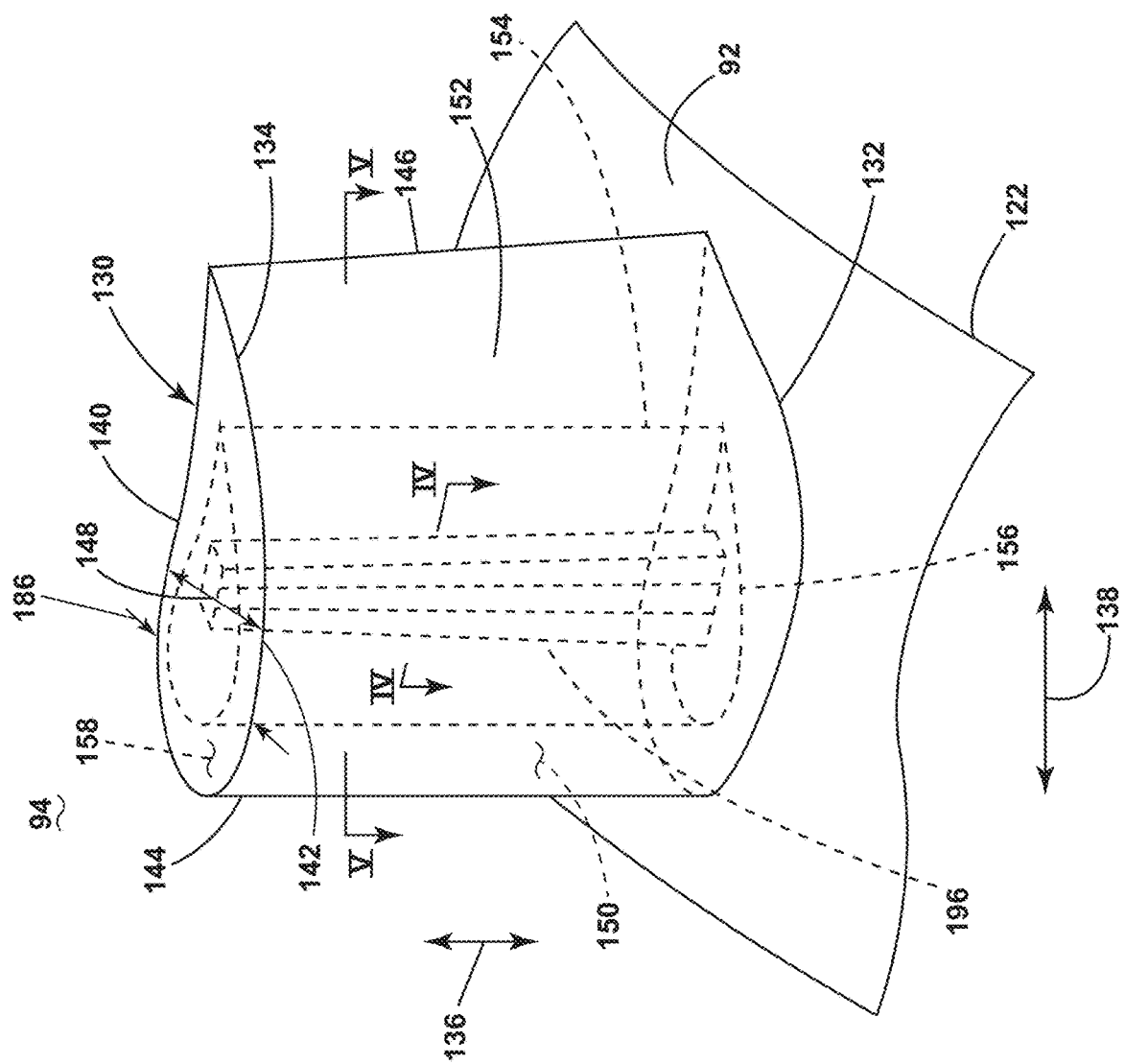
FIG. 3 is a perspective view of the electrical strut as an airfoil having an interior with at least one electrical conduit located within the interior according to aspects of the present disclosure.

FIG. 3 is a perspective view of the electrical strut 94. The electrical strut 94 can define an airfoil 130 extending radially between a root 132 and a tip 134 to define a span-wise 136 direction. The airfoil 130 can extend from the inner band 122 and be mounted to the platform 92 at the root 132. While the outer band 124 has been removed for clarity, it should be understood that the airfoil 130 can be mounted at the tip 134 to the outer band 124. The airfoil 130 can have a concave-shaped pressure side 140 and a convex-shaped suction side 142 which are joined together to define an airfoil shape extending axially between a leading edge 144 and a trailing edge 146 to define a chord-wise direction 138. The electrical strut 94 can further extend between the pressure and suction sides 140, 142 to define a lateral direction 148. A maximum dimension in the lateral direction 148 can be defined as a maximum thickness 186 of the airfoil 130 for the electrical strut 94.

The electrical strut 94 can have an interior 150 bound by an outer wall 152 and defined by the pressure and suction sides 140, 142. At least one cooling passage 154 can be formed within the interior 150. The at least one cooling passage 154 can extend radially within the interior 150. It should be understood that the interior 150 can include multiple cooling passages. Interior walls 156 can define the at least one cooling passage 154 and can separate the at least one cooling passage 154 from a remaining portion 158 of the interior 150. In one non-limiting aspect of the disclosure discussed herein, investment casting can be utilized to manufacture the at least one cooling passage 154 by developing an investment casting core. In another aspect, direct metal manufacturing techniques can be utilized to manufacture the blade and cooling circuit. The at least one electrical conduit 96 can extend radially within the at least one cooling passage 154.

Figure 4:
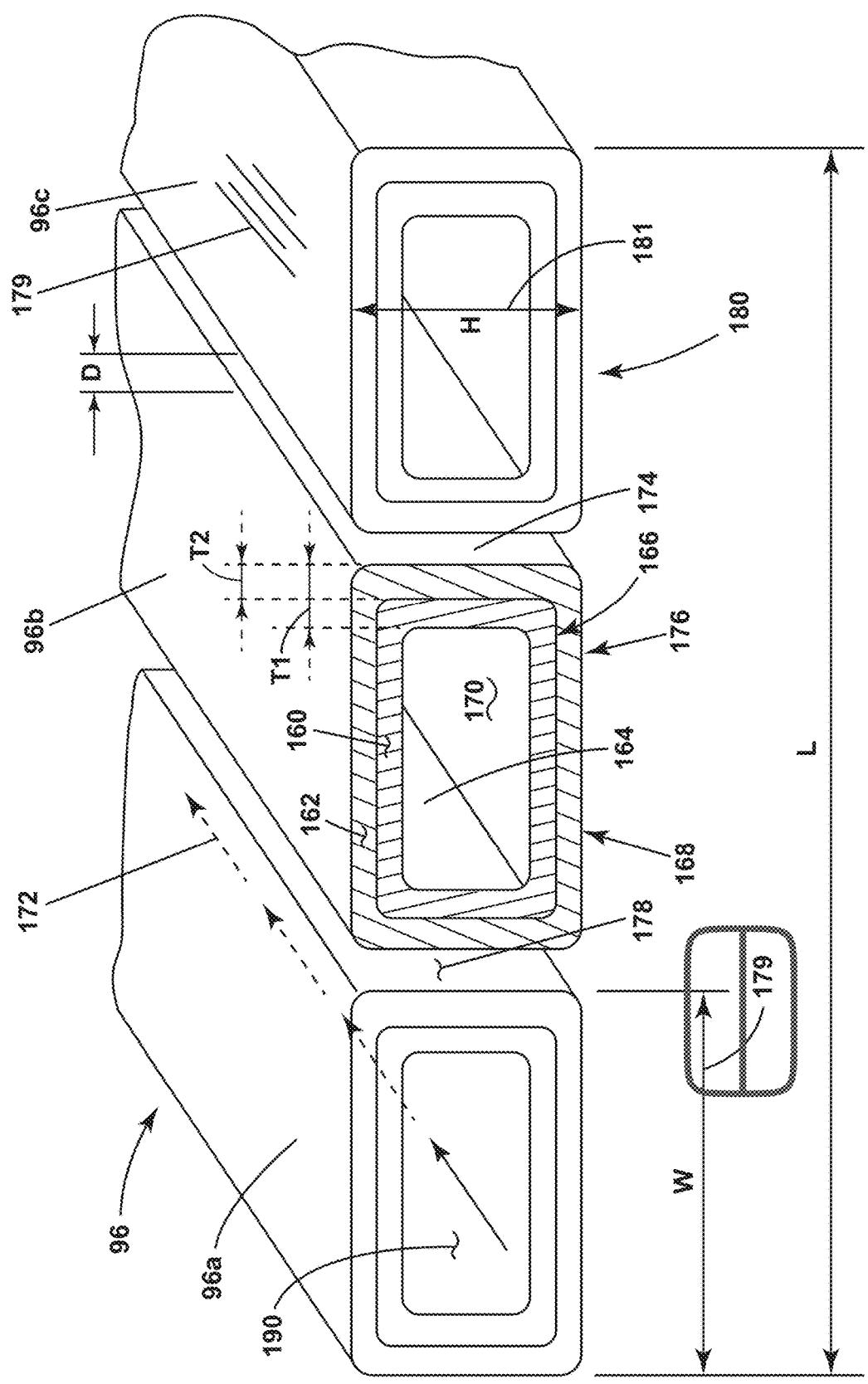
FIG. 4. is a cross-sectional view taken along line IV-IV of FIG. 3 illustrating an enlarged view of a cross-sectional area of the at least one electrical conduit as three electrical conduits defining a conduit grouping.

FIG. 4 is a cross-sectional view of the at least one electrical conduit 96 taken along line IV-IV of FIG. 3. While any number of electrical conduits 96 are contemplated, three electrical conduits 96a, 96b, 96c are illustrated. It should be understood that the attributes described according to the at least one electrical conduit 96 apply to all the illustrated electrical conduits 96a, 96b, 96c. Further the attributes would be applicable to any of at least one electrical conduit 96 in multiple arrangements, by way of non-limiting example a multiplication of the three conduits 96a, 96b, 96c, i.e. 6 conduits, 9 conduits, etc, is also contemplated.

It can more clearly be seen that the at least one electrical conduit 96 can have multiple layers 160, 162. At least one conductor 166 can define a first layer 160. A cooling conduit 164 can be formed from the at least one conductor 166, by way of non-limiting example an electric busbar, and be made of any suitable material including, by way of non-limiting example copper or aluminum. It is further contemplated that the at least one conductor 166 is a plurality of wires, or an AC cable, housed in the electrical conduit 96. The first layer 160 can have a thickness (T1) of anywhere between 1 and 2 mm, and more specifically between 1.4 and 1.6 mm. The thickness (T1) can be 1.5 mm. The cooling conduit 164 can be formed in a rounded rectangular shape 168 defining a hollow interior 170. While illustrated as a rounded rectangular shape 168, it should be understood that the cooling conduit 164 can be formed in any suitable shape to define a hollow interior 170. The hollow interior 170 can extend along the span-wise direction 136 to define a cooling flow path 172. The cooling conduit 164 can enable a flow of any suitable cooling fluid along the cooling flow path 172, by way of non-limiting example bleed air or liquid coolant. It is contemplated that the cooling flow path 172 utilizes the same cooling as the at least one cooling passage 154. Utilizing existing paths with preexisting airflows to obtain the cooling fluid for flow along the cooling flow path 172 minimizes or eliminates any additional directing of cooling fluid.

An insulating conduit 174 can define a second layer 162. The insulating conduit 176 can be formed from at least one insulator 176, by way of non-limiting example electrical insulation such as mica tape wrapped around the first layer 160. The second layer 162 can have a can have a thickness (T2) of anywhere between 1 and 2 mm, and more specifically between 1.4 and 1.6 mm. The thickness (T2) can be 1.5 mm. The insulating conduit 174 can also be formed in the rounded rectangular shape 168 and extend in the span-wise direction to define an exterior 178 the at least one electrical conduit 96.

The exterior 178 of the insulating conduit 174 can define a cross-sectional area 190 having a width (W) and a height (H) together defining an aspect ratio for the cross-sectional area 190. The width (W) of the at least one electrical conduit 96 can extend generally in the chord-wise direction 138 and the height (H) of the at least one electrical conduit 96 can extend generally in the lateral direction 148. The width (W) can define a maximum dimension 188 of between 15 and 17 mm, and more specifically equal to 16 mm+/−0.5 mm. The height (H) can define a minimum dimension 181 of between 9 and 11 mm, more specifically equal to 10 mm+/−0.5 mm. The aspect ratio of the cross-sectional area 190 can therefore be 4:1. The electrical conduits 96a, 96b, 96c can be spaced from each other a distance (D) of between 0.5 and 5.0 mm measured from the exterior 178 of sequential electrical conduits 96. Spacing the electrical conduits can be tuned to minimize proximity losses. Proximity loss being a component of the total current losses related to a distance between the at least one conductor 166 forming each of the electrical conduits 96a, 96b, 96c.

It is further contemplated that the exterior 178 is wrapped in an electromagnetic shielding layer 179. The electromagnetic shielding layer 179 can be made of any suitable material, by way of non-limiting example semi conductive tape or varnish where the material minimizes electromagnetic interference/emission. The electromagnetic shielding layer 179 can have a thickness of 0.1 to 0.3 mm that minimally effects the dimensions already described herein.

Together electrical conduits 96a, 96b, 96c can define a conduit grouping 180 having a length (L) of between 45 and 80 mm, and more specifically equal to 55 mm+/−5 mm. It should be understood that the conduit grouping 180 can have the same height (H) as each individual electrical conduit 96a, 96b, 96c.

Figure 5:
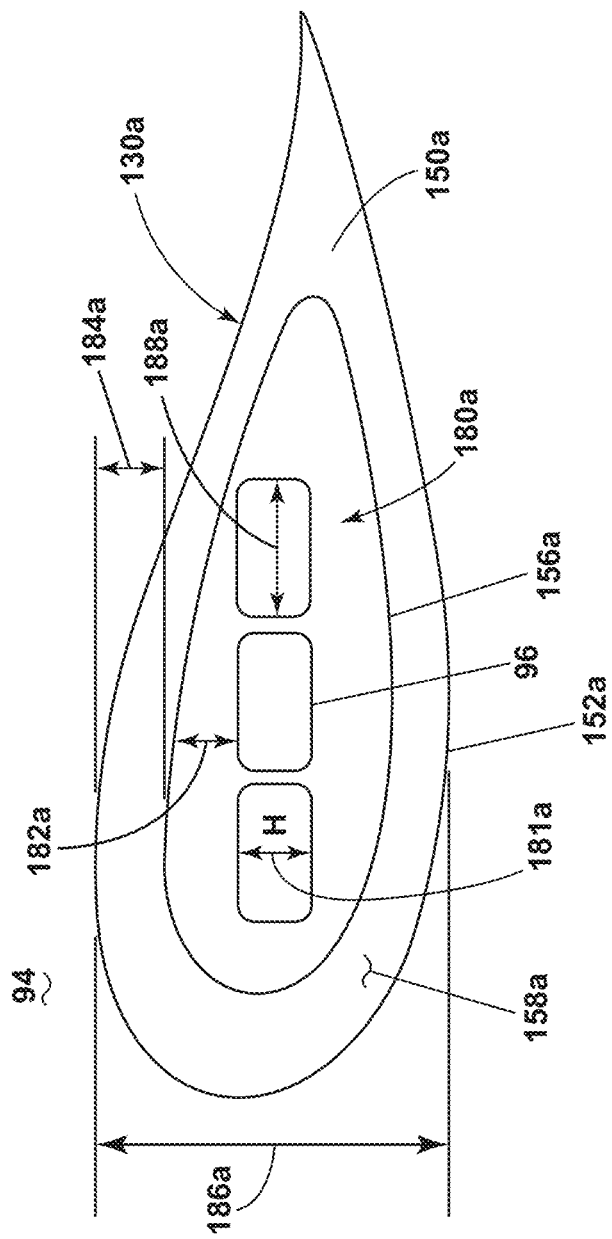
FIG. 5 is a cross-sectional view taken along line V-V of FIG. 3 illustrating the conduit grouping from FIG. 4 according to one aspect of the disclosure herein.

FIG. 5, is a schematic cross-section taken along line V-V of FIG. 3. A first conduit grouping 180a is schematically illustrated within interior walls 156a of the electrical strut 94. Orienting the conduit grouping 180a with the height (H) defining a minimum dimension 181a leaves a margin 182a of space between the conduit grouping 180a and the interior walls 156*a*. This margin 182*a* is determined by the cross-sectional area 190 needed for airflow volume. A remaining portion 158*a* of an interior 150*a*, located between the interior walls 156*a* and an outer wall 152*a* defining airfoil 130*a*, defines a boundary 184*a*. The boundary 184*a* is preferably between 0.5 to 1.5 mm. The margin 182*a*, boundary 184*a*, and height (H) of the conduit grouping 180*a* together determine a maximum thickness 186*a* of the airfoil 130*a*. This orientation of the conduit grouping 180*a* can minimize the maximum thickness 186*a*.

Figure 6:
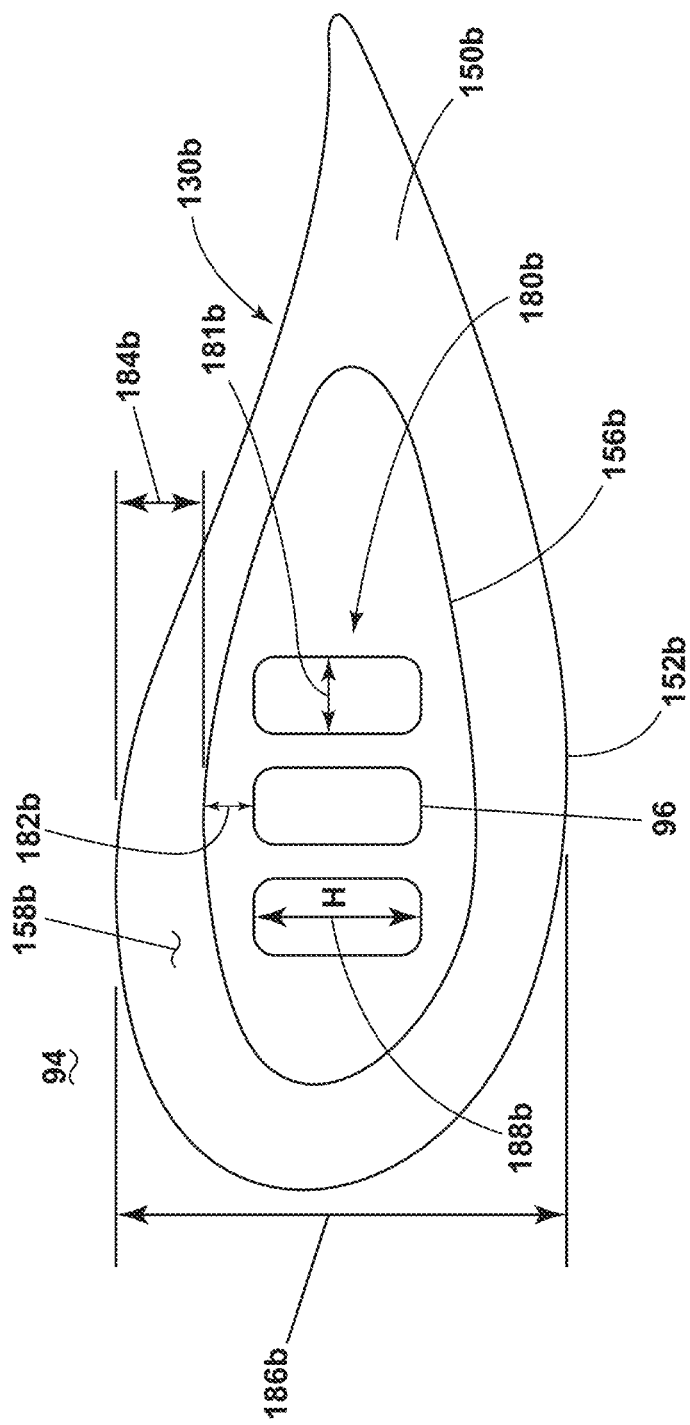
FIG. 6 is an alternative cross-sectional view taken along line V-V of FIG. 3 illustrating the conduit grouping from FIG. 4 according to another aspect of the disclosure herein.

FIG. 6, is a variation of the schematic cross-section taken along line V-V of FIG. 3. A second conduit grouping 180*b* is schematically illustrated within interior walls 156*b* of the electrical strut 94. In this orientation, the width (W) can define a minimum dimension 181*b* and the height (H) can define a maximum dimension 188*b*. The aspect ratio of a cross-sectional area 190 can therefore be 1:4 in this orientation. Orienting the conduit grouping 180*b* with the height (H) defining a maximum dimension 188*b* leaves a margin 182*b* of space between the conduit grouping 180*b* and the interior walls 156*b*. While illustrated as smaller than the margin 182*a*, the margin 182*b* is determined by the overall area needed to provide the required airflow and can therefore be equal to, greater than, or less than the margin 182*a*. A remaining portion 158*b* of an interior 150*b*, located between the interior walls 156*b* and an outer wall 152*b* defining airfoil 130*b* defines a boundary 184*b*. The boundary 184*a* is preferably between 0.5 and 1.5 mm. This orientation of the conduit grouping 180*b* can maximize stiffness of the electrical conduits 96 of the same profile, in turn minimizing low cycle fatigue of the conductor 166 due to engine vibrations during operation.

It is contemplated that the orientation of the conduit groupings 180, 180*a*, 180*b* as described herein can vary between cross-sectional areas defining an aspect ratio of 4:1 to cross-sectional areas defining an aspect ratio of 1:4 and anywhere in between. More specifically, the width (W) as described herein can generally extend in the chord-wise direction or in both the chord-wise and lateral direction, for example 45 degrees from either of the orientations described herein. Likewise, the height (H) as described herein can generally extend in the lateral direction or in both the chord-wise and lateral direction, for example 45 degrees from either of the orientations described herein. In this manner the aspect ratio of the cross-sectional area 190 can be tuned to minimize the maximum thickness 186 of the airfoil 130 and maximize the stiffness of the at least one electrical conduit 96.

Figure 7:
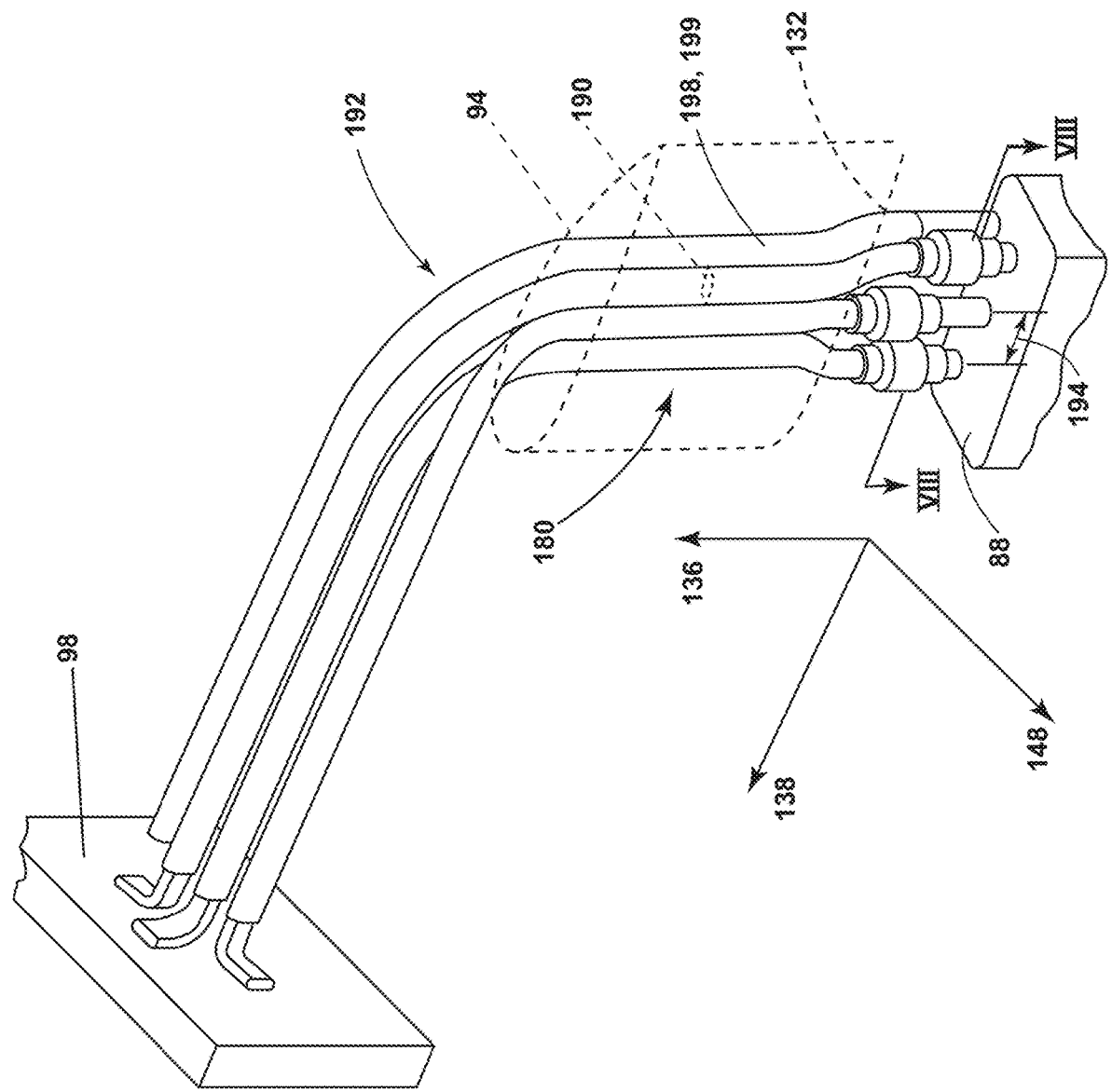
FIG. 7 is perspective view of the conduit grouping extending between the generator and the power converter according to aspects of the present disclosure.

Turning to FIG. 7, a perspective view of the conduit grouping 180 is illustrated with the electrical strut 94 illustrated in phantom for clarity. It can more clearly be seen that the conduit grouping 180 extends from the generator 88 in the span-wise direction 136 radially outward toward a turn 192 proximate the tip 134. Each of the electrical conduits 96*a*, 96*b*, 96*c* bend at the turn 192 and extend in the chord-wise direction 138 axially out of the electrical strut 94 and toward the power converter 98. The cross-sectional area 190 of each electrical conduit 96*a*, 96*b*, 96*c* can change proximate the root 132 and the turn 192. More specifically, more room near the generator 88 and the power converter 98 enable larger spacings 194 between electrical conduits 96*a*, 96*b*, 96*c*. The orientation of the conduit grouping 180*b* maximizes stiffness by changing the cross-sectional area 190 and the vertical/horizontal orientations as described to better withstand any externally induced vibrations. An additional conduit 198 can define a neutral line 199.

Figure 8:
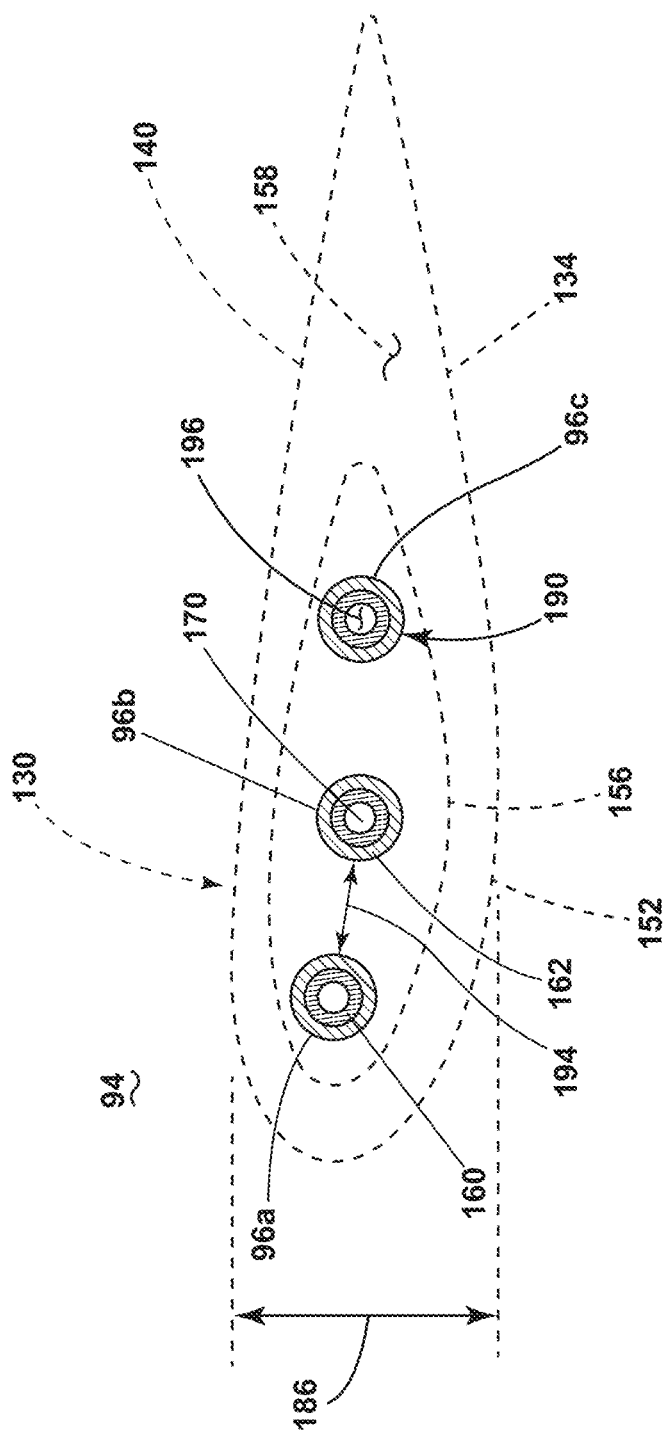
FIG. 8 is a cross-sectional view taken along line VIII-VIII of FIG. 7 illustrating a cross-sectional area of the at least one electrical conduit as three electrical conduits at a different location than the cross-sectional view of FIG. 4.

FIG. 8 is a cross-section taken along line VIII-VIII of FIG. 7. The electrical conduits can define circular cross-sectional areas 196, as is a more typical shape of a conduit, where exiting the electrical strut 94 illustrated in phantom. This change in cross-sectional area 190 enables a typical connection with electrical components, specifically the generator 88 and the power converter 98 described herein, while simultaneously minimizing the maximum thickness 186 of the airfoil 130 and maximizing the stiffness of the at least one electrical conduit 96 as previously described herein.

Benefits of aspects of the disclosure include effective cooling of the conductors described herein by flowing a cooling fluid through the cooling conduit. Along with a compressed and thin taped electromagnetic shielding layer, the hollow conductor improves heat transfer. At high frequencies current can flow through an outer part of a conductor leaving an inner portion of the conductor unused, this is called a skin effect. Removing material from the inside decreases weight without negatively effecting the current carrying capability of the conductor. Flexibility in cross-section size and more importantly size of the 160 wall thickness results in minimizing any negative impact on strut thickness and also minimizes the skin effect related losses in 160 electrical conductor.

The electrical struts can have a minimal thickness to be more streamlined or aerodynamic. Further, the electrical struts as described herein can be more structurally sound. A tuning of the benefits associated with the dimensions of the cross-sectional area of the electrical conduits as described herein enables a balance of aerodynamics and structural soundness. Tuning enables multiple dimensional changes depending on the location and use of the electrical strut during operation.

Furthermore, an improved airflow through proximate the electrical struts as described herein can result in increased fuel efficiencies. More specifically, a specific fuel burn gain of 0.01% and up to 0.02% can be achieved by integrating the electrical busbars within the electrical struts as described herein. Fuel savings between 1 and 2% are enabled due to the electric power support within an engine as a whole. The electrical conduits described herein improve the overall electrical system efficiency.

While AC cables are contemplated as being carried by the electrical conduits described herein, the conductor, and more specifically the electric busbars integrated within the electrical struts have a few advantages over ac cables. The rounded rectangular shape enables flexibility in cross-section resulting in minimizing negative impact on the electrical strut thickness. As previously mentioned the electric busbars can improve heat transfer resulting from using a hollow conductor and the taped insulation. Further, the electric busbars can reduce ac losses via a thin wall aluminum conductor, avoiding the need to use a more complicated multistrand wire or cable, by way of non-limiting example Litz wire.

The electrical struts as described herein can be manufactured utilizing additive manufacturing technologies or other advanced casting manufacturing technologies such as investment casting and 3-D printing and laser drilling and EDM drilling. The technologies available provide cost benefits along with the other benefits described. It should be understood that other methods of forming the cooling circuits and cooling holes described herein are also contemplated and that the methods disclosed are for exemplary purposes only.

It should be appreciated that application of the disclosed design is not limited to turbine engines with fan and booster sections, but is applicable to turbojets and turboprop engines as well.

This written description uses examples to describe aspects of the disclosure described herein, including the best mode, and also to enable any person skilled in the art to practice aspects of the disclosure, including making and using any devices or systems and performing any incorporated methods. The patentable scope of aspects of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the disclosure are provided by the subject matter of the following clauses:

An airfoil for a turbine engine, the airfoil comprising an outer wall having a pressure side, a suction side, a leading edge, and a trailing edge, the outer wall defining an interior, wherein the outer wall extends between the pressure side and the suction side to define a lateral direction, between the leading edge and the trailing edge to define a chord-wise direction, and between a root and a tip to define a span-wise direction; at least electrical conduit extending within the interior along the span-wise direction and defining a cooling conduit with a hollow interior.

The airfoil of any preceding clause, wherein the cooling conduit is formed by at least one conductor.

The airfoil of any preceding clause, wherein the at least one electrical conduit comprises multiple layers, the at least one conductor defining a first layer and an insulator defining a second layer surrounding the first layer and defining an exterior of the at least one electrical conduit.

The airfoil of any preceding clause, comprising an electromagnetic shielding layer surrounding the exterior.

The airfoil of any preceding clause, wherein the at least one conductor is an electrical busbar.

The airfoil of any preceding clause, wherein a cross-sectional area of the at least one electrical conduit has a width oriented along the chord-wise direction and a height oriented along the lateral direction, the width and height together defining an aspect ratio of the cross-sectional area.

The airfoil of any preceding clause, wherein the aspect ratio value is equal to or falls between 1:4 and 4:1.

The airfoil of any preceding clause, wherein the width is greater than the height.

The airfoil of any preceding clause, wherein the largest dimension measured along the lateral direction between the pressure side and suction side defines a maximum thickness of the airfoil and the at least one electrical conduit is oriented within the interior to minimize the maximum thickness of the airfoil by minimizing the height.

The airfoil of any preceding clause, wherein the width is less than the height.

The airfoil of any preceding clause, wherein the at least one electrical conduit is oriented within the interior to maximize a stiffness of the electrical conduit by maximizing the height.

The airfoil of any preceding clause, wherein the at least one electrical conduit is multiple electrical conduits defining a conduit grouping adapted for carrying three phase power.

The airfoil of any preceding clause, wherein the conduit grouping further comprises a neutral line.

The airfoil of any preceding clause, further comprising an interior wall defining a cooling passage within the airfoil and nested within the outer wall and wherein the at least one electrical conduit is located within the cooling passage.

A turbine engine comprising an engine core; a core casing surrounding the engine core; at least one cowl surrounding the core casing; a power converter located between the at least one cowl and the core casing; a generator disposed within the engine core; at least one electrical strut having an outer wall defining an interior and extending radially between the engine core and the core casing; at least one electrical conduit located within the interior and electrically coupling the generator to the power converter.

The turbine engine of any preceding clause, wherein the generator is located proximate an aft portion of the engine and the power converter is located proximate a forward portion of the engine.

The turbine engine of any preceding clause, wherein the outer wall defines an airfoil shape extending between a pressure side and a suction side to define a lateral direction, between a leading edge and a trailing edge to define a chord-wise direction, and between a root and a tip to define a span-wise direction, and wherein a cross-sectional area of the at least one electrical conduit has a width oriented along the chord-wise direction and a height oriented along the lateral direction, the width and height together defining an aspect ratio of the cross-sectional area.

The turbine engine of any preceding clause, wherein the largest dimension measured along the lateral direction between the pressure side and suction side defines a maximum thickness of the airfoil and the at least one electrical conduit is oriented within the interior to minimize the maximum thickness of the airfoil by minimizing the height.

The turbine engine of any preceding clause, wherein the at least one electrical conduit comprises an electrical busbar.

The turbine engine of any preceding clause, wherein the at least one electrical conduit is multiple electrical conduits defining a conduit grouping adapted for carrying three phase power.

A method of forming an airfoil for a turbine engine, the method comprising: forming an outer wall having a pressure side, a suction side, a leading edge, and a trailing edge, the outer wall defining an interior, wherein the outer wall extends between the pressure side and the suction side to define a lateral direction, between the leading edge and the trailing edge to define a chord-wise direction, and between a root and a tip to define a span-wise direction; and extending at least one electrical conduit within the interior along the span-wise direction and to define a cooling conduit with a hollow interior; wherein a cross-sectional area of the at least one electrical conduit has a width oriented along the chord-wise direction and a height oriented along the lateral direction, the width and height together defining an aspect ratio of the cross-sectional area; and wherein the largest dimension measured along the lateral direction between the pressure side and suction side defines a maximum thickness.

The method of any preceding clause, further comprising is orienting the at least one electrical conduit within the interior to minimize the maximum thickness of the airfoil by minimizing the height.

The method of any preceding clause, further comprising orienting the at least one electrical conduit within the interior to maximize a stiffness of the electrical conduit by maximizing the height.

A method of directing a current through an airfoil located in a turbine engine, the method comprising flowing a current through at least one conduit having an outer insulating layer and located within an interior of the airfoil; carrying the current through a conducting layer surrounded by the insulating layer; and passing a cooling airflow through an airflow conduit defined by the conducting layer and central to the at least one conduit.

The method of any preceding clause, further comprising minimizing electromagnetic interference with a shielding layer surrounding the insulating layer.

The method of any preceding clause, further comprising directing the current from an electric machine located in a tail-cone section of the turbine engine to a power converter located in a front section of the turbine engine.

What is claimed is:

1. An airfoil for a turbine engine, the airfoil comprising:
   an outer wall having a pressure side, a suction side, a leading edge, and a trailing edge, the outer wall defining an interior and separating the interior from an exterior, wherein the outer wall extends between the pressure side and the suction side to define a lateral direction, between the leading edge and the trailing edge to define a chord-wise direction, and between a root and a tip to define a span-wise direction; and
   multiple electrical conduits extending from the exterior into the interior along the span-wise direction, at least one electrical conduit of the multiple electrical conduits comprising:
   at least one conductor forming a cooling conduit with a hollow interior having a central axis along which at least a portion of a cooling flow path extends;
   wherein the at least one conductor surrounds the cooling flow path; and
   wherein the multiple electrical conduits are spaced from each other a first distance in the exterior and a second distance less than the first distance within the interior.

2. The airfoil of claim 1, wherein the at least one conductor is an electric busbar.

3. The airfoil of claim 1, wherein the at least one electrical conduit comprises multiple layers, the at least one conductor defining a first layer and an insulator defining a second layer surrounding the first layer and the insulator defining an exterior of the at least one electrical conduit.

4. The airfoil of claim 3, comprising an electromagnetic shielding layer surrounding the exterior of the at least one electrical conduit.

5. The airfoil of claim 1, wherein a cross-sectional area of each of the electrical conduits has a width oriented along the chord-wise direction and a height oriented along the lateral direction, the width and height together defining an aspect ratio of the cross-sectional area.

6. The airfoil of claim 5, wherein the aspect ratio is between 1:4 and 4:1, inclusive of endpoints.

7. The airfoil of claim 5, wherein the width is greater than the height.

8. The airfoil of claim 5, wherein the width is less than the height.

9. The airfoil of claim 1, wherein the multiple electrical conduits define a conduit grouping adapted for carrying three phase power.

10. The airfoil of claim 9, wherein the conduit grouping further comprises a neutral line.

11. The airfoil of claim 1, further comprising an interior wall defining a cooling passage within the airfoil and nested within the outer wall and wherein each of the electrical conduits is located within the cooling passage.

12. The airfoil of claim 1 wherein the cooling conduit is formed in a rounded rectangular shape.

13. A method of forming the airfoil of claim 1, the method comprising:
   forming the outer wall; and
   extending each of the electrical conduits within the interior along the span-wise direction;
   wherein a cross-sectional area of the at least one electrical conduit has a width oriented along the chord-wise direction and a height oriented along the lateral direction, the width and the height together defining an aspect ratio of the cross-sectional area; and
   wherein the largest dimension measured along the lateral direction between the pressure side and the suction side defines a maximum thickness.

14. The method of claim 13, further comprising orienting each of the electrical conduits within the interior to minimize the maximum thickness of the airfoil by minimizing the height.

15. The method of claim 13, further comprising orienting each of the electrical conduits within the interior to maximize a stiffness of each of the electrical conduits by maximizing the height.

16. A turbine engine comprising:
   an engine core;
   a core casing surrounding the engine core;
   at least one cowl surrounding the core casing;
   a power converter located between the at least one cowl and the core casing;
   an electrical generator disposed within the engine core;
   at least one electrical strut having an outer wall defining an interior, separating the interior from an exterior, and extending radially between the engine core and the core casing; and
   multiple electrical conduits extending from the exterior into the interior and electrically coupling the electrical generator to the power converter, at least one electrical conduit of the multiple electrical conduits comprising at least one conductor forming a cooling conduit with a hollow interior having a central axis along which at least a portion of a cooling flow path extends;
   wherein the at least one conductor surrounds the cooling flow path; and
   wherein the multiple electrical conduits are spaced from each other a first distance in the exterior and a second distance less than the first distance within the interior.

17. The turbine engine of claim 16, wherein the electrical generator is located proximate an aft portion of the engine and the power converter is located proximate a forward portion of the engine.

18. The turbine engine of claim 16, wherein the at least one electrical conduit comprises an electric busbar.

19. The turbine engine of claim 16, wherein the outer wall defines an airfoil shape extending between a pressure side and a suction side to define a lateral direction, between a leading edge and a trailing edge to define a chord-wise direction, and between a root and a tip to define a span-wise direction, and wherein a cross-sectional area of the at least one electrical conduit has a width oriented along the chord-wise direction and a height oriented along the lateral direction, the width and height together defining an aspect ratio of the cross-sectional area.

20. The turbine engine of claim 19, wherein a largest dimension measured along the lateral direction between the pressure side and suction side defines a maximum thickness of the airfoil and the multiple electrical conduits are oriented within the interior to minimize the maximum thickness of the airfoil by minimizing the height.

\* \* \* \* \*